United States Patent [19]

Brackett

[11] 3,792,375

[45] Feb. 12, 1974

[54] SUPPRESSION OF SPURIOUS BIAS CIRCUIT OSCILLATIONS IN IMPATT OSCILLATORS

[75] Inventor: Charles Arthur Brackett, Berkeley Heights, N.J.

[73] Assignee: Bell Telephone Laboratories, Incorporated, Murray Hill, Berkeley Heights, N.J.

[22] Filed: Nov. 8, 1972

[21] Appl. No.: 304,629

[52] U.S. Cl. ............... 331/96, 331/105, 331/107 R, 331/185

[51] Int. Cl. ........................ H03b 1/04, H03b 7/14

[58] Field of Search ........... 331/96, 105, 107 R, 185

[56] References Cited

UNITED STATES PATENTS

| | | | |
|---|---|---|---|
| 3,510,802 | 5/1970 | Carlson | 331/117 D |
| 3,534,293 | 10/1970 | Harkless | 331/107 R |
| 3,621,463 | 11/1971 | Olson, Jr. | 331/107 R X |

OTHER PUBLICATIONS

Magalhaes et al., "A Single-Tuned Oscillator for IMPATT Characterizations," Proceedings of the IEEE, May 1970, pp. 831–832.

*Primary Examiner*—Herman Karl Saalbach
*Assistant Examiner*—Siegfried H. Grimm
*Attorney, Agent, or Firm*—R. B. Anderson

[57] ABSTRACT

Spurious oscillations in the dc bias circuit of an Impatt oscillator are suppressed by including in the bias circuit a filter which is external of the microwave resonator. The filter includes an inductance for shunting a dissipative resistance and for providing a low-loss path for the dc bias current. Specific design criteria for the filter are disclosed.

11 Claims, 24 Drawing Figures

SUPPRESSION OF SPURIOUS BIAS CIRCUIT OSCILLATIONS IN IMPATT OSCILLATORS

BACKGROUND OF THE INVENTION

This invention relates to negative resistance oscillators, and, more particularly, to microwave frequency oscillators using an Impatt diode as the active element.

Impatt diode oscillators generally comprise a negative resistance diode, known as an Impatt diode, mounted within a cavity resonator. The diode is periodically biased to avalanche breakdown by a combination of dc current applied through a dc circuit, and microwave energy applied by the resonator. During operation, dc energy is converted to microwave energy, which is derived from the resonator as a useful output. More complete discussions of Impatt diode oscillators are included in, for example, the U.S. Pat. No. of B. C. De Loach, Jr., 3,270,293, assigned to Bell Telephone Laboratories, Incorporated, and the paper, "Recent Advances in Solid State Microwave Generators," by De Loach, *Advances in Microwaves*, Vol. 2, 1967, Academic Press, Incorporated.

One serious quality control problem with Impatt oscillators is the relatively high number of diodes that burn out when biased to only moderately high power levels. It has been determined that the cause of this problem is the tendency of the dc bias circuit to break into spurious oscillations, particularly in the megacycle frequency range. This problem and one proposed solution is described in the U.S. Pat. No. of H. M. Olson, Jr., 3,621,463, assigned to Bell Telephone Laboratories, Incorporated.

The Olson patent teaches that submicrowave frequency attenuators such as damping resistors located outside the microwave resonator are ineffective in solving this problem. The solution offered in the Olson patent is to use a coaxial cable section as the microwave resonator and to include a resistor-capacitor combination in the coaxial cable inner conductor closely adjacent the diode to give a high impedance at the spurious submicrowave frequency with minimal loss to the designer's microwave frequency.

The most serious drawback of the Olson device is that all of the diode bias current is directed through the damping resistor in the coaxial cable inner conductor. This results in a substantial dc power loss, which may be tolerable with silicon Impatt diodes, but which seriously limits the potential of newer diode forms, particularly gallium arsenide Schottky-barrier Impatt diodes.

Gallium arsenide Impatts are promising because of a potential for high-power, high-efficiency, low-noise operation. However, under conditions of high-power operation, they may be designed to draw two or three times as much dc bias current as a silicon diode, and, if all of this current must be channeled through a resistor, the losses may become substantial and the local heat generated may burn out the diode, reduce its efficiency, or undesirably increase the noise output. In any case, the practical result has been that, unless high dc power losses are sustained, gallium arsenide Impatt oscillators have heretofore been restricted to power outputs substantially lower than those of which they are capable.

SUMMARY OF THE INVENTION

Accordingly, it is an object of this invention to eliminate spurious oscillations in the bias circuit of an Impatt oscillator in a manner that does not significantly increase dc power consumption.

It is another object of this invention to eliminate spurious oscillations in an Impatt oscillator in a manner consistent with high efficiency and low noise operation.

These and other objects of the invention are attained in any of a number of Impatt oscillator structures through the use of concepts arrived at through detailed analysis of the problem. Specifically, the nature of the unwanted negative resistance giving rise to bias circuit oscillation has been determined and design criteria for eliminating it have been formulated. Conformance with these criteria permits the designer to construct any of a number of Impatt diode bias circuits such as to have a sufficient positive impedance at all frequencies to avoid spurious oscillation.

In a preferred embodiment, circuit oscillations are prevented by a filter external of the microwave resonator comprising an inductance in parallel with a resistance. The resistance increases the positive circuit impedance to prevent oscillations, while the inductance shunts bias current around the resistance to minimize dc current loss.

As will be explained later, one of the criteria is that the bias circuit impedance conforms to the relationship $$Z_B > R_n - R_{sc} \quad (1)$$

where $R_{sc}$ is the space charge resistance of the Impatt diode, $R_n$ is the negative resistance of the diode tending to give spurious oscillation at an unwanted frequency, and $Z_B$ is the bias circuit impedance at zero frequency.

The other major criterion involves determination of a parameter that will be known as the "diode quenching impedance" $Z_Q$, to be explained more fully hereinafter. The bias circuit impedance is a function of frequency and may be denoted $Z_B(f_1)$ while the diode quenching impedance may be denoted as $Z_Q(f_2)$. In accordance with this criterion, the bias circuit will be stable if the resistive part of $Z_B$ is always larger than the resistive part of $Z_Q$, or alternatively, if $Z_B(f_1)$ equals $Z_Q(f_2)$ only when $f_1$ is smaller than $f_2$. This latter statement will be better understood with reference to a Smith chart, but it may be alternately stated mathematically as follows:

$$Z_B(f_1) \overset{lim}{\rightrightarrows} Z_Q(f_2)\ f_1 < f_2 \quad (2)$$

Compliance with these criteria gives the designer flexibility in constructing a number of different oscillator structures rather than being limited to the use of a resistor which is physically near the Impatt diode, and which dissipates bias current, as taught in the Olson patent. In one convenient embodiment, the microwave cavity is a waveguide section and the diode is biased with a bias line that extends transversely across the waveguide section, rather than axially, as in the Olson patent. The diode may then effectively be on one side of the microwave cavity with the bias filter being on the other side. The filter includes an inductance for shunting a dissipative resistance and providing a low-loss path for dc bias current. Numerous other designs may be made through compliance with the inventive concepts which, together with other objects, features and advantages of the invention will be better understood from a consideration of the detailed description, taken in conjunction with the accompanying drawing.

DRAWING DESCRIPTION

DETAILED DESCRIPTION

Figure 1:
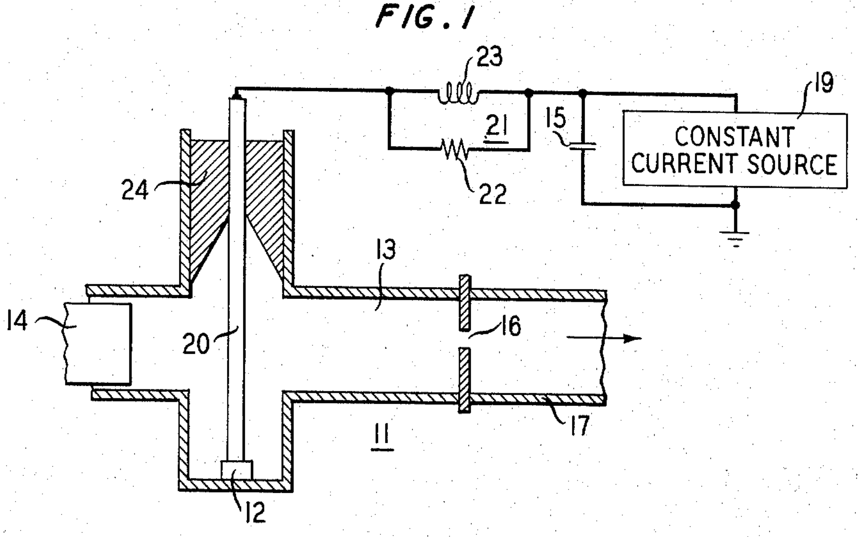
FIG. 1 is a schematic diagram of an illustrative embodiment of the invention.

Referring now to FIG. 1 there is shown an illustrative embodiment of the invention in which an Impatt oscillator 11 comprises an Impatt diode 12 contained within a cavity resonator 13. The cavity resonator is essentially a waveguide section which is tuned by a tuning plunger 14 and from which output microwave energy is derived through an iris 16 and propagated along a waveguide 17 as shown by the arrow. A diode bias circuit comprises a dc current source 19 for transmitting current to the diode via a conductor 20 that extends across the waveguide transversely to the direction of microwave propagation.

As is known, the dc source, in conjunction with the resonator 13, periodically biases diode 12 to avalanche breakdown such as to cause current pulses to travel through the diode. A proper relationship between current transit time and applied diode voltage results in a negative resistance that gives desired microwave generation at a predictable frequency. The problem with which the invention deals is the tendency of the diode to display a negative resistance at lower submicrowave frequencies, thereby causing spurious oscillations in the bias circuit. The bias circuit includes a microwave absorber 24 which prevents microwave energy from propagating toward the dc source, but which is ineffective in suppressing lower frequencies. The circuit also includes a parasitic capacitance 15.

In accordance with the invention, spurious submicrowave frequencies are suppressed by a filter 21 in the bias circuit comprising a resistance 22 and an inductance 23. The inductance 23 provides a dc shunt of the resistance, thereby to minimize resistive losses of the dc current delivered to the diode. Contrary to the teaching of the Olson patent, the resistance 22 is physically remote from the diode and may be completely external of the microwave resonator. This and other features of the new bias circuit are possible through compliance with design criteria which I have established for suppressing spurious bias circuit oscillations.

As derived in Appendix II, the low frequency impedance $Z_t$ of the diode is shown to be $$Z_t = R_{sc} - R_n/(1+j\,\omega/a) \tag{3}$$

where $R_{sc}$ is the space-charge resistance of the Impatt diode, $R_n$ is the negative resistance of the diode at the submicrowave frequency of interest $\omega$, defined more explicitly in Appendix I, and $a$ is given by the equation $$a = (r^2 + s^2/\,\partial Y/\partial\omega)\, G \sin F \tag{4}$$

where $r$ and $s$ are saturation parameters associated with the large signal behavior of the diode admittance $y_d$ as defined more explicitly in Appendix II, $Y$ is the admittance of the microwave circuit, $G$ is the conductance of the microwave circuit, and F is an angle between the impedance characteristics as defined more fully in Appendix I.

When $Z_t$ is negative at a submicrowave frequency $\omega$ then the bias circuit may oscillate at that frequency. An important parameter of the present invention is the diode quenching impedance, which is the bias circuit impedance needed barely to quench circuit oscillations resulting from a diode negative resistance. As such, the diode quenching impedance $Z_Q$ is equal in magnitude to the diode negative impedance at the frequency in question, or:

$$Z_Q = -Z_t \tag{5}$$

Figure 2:
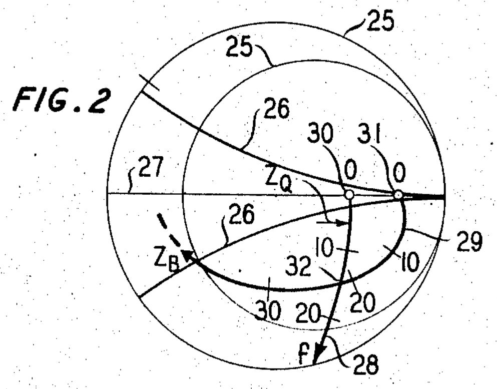
FIG. 2 is a graph of a Smith chart illustrating certain criteria for bias circuit stability in accordance with the invention.

Referring now to FIG. 2, there is shown an impedance graph of the type generally known as a Smith chart wherein curves 25 represent loci of constant resistance and curves 26 represent loci of constant reactance. The area above centerline 27, which is the zero reactance line of the graph, represents the positive or inductive reactance domain while the area below represents the negative or capacitive reactance domain.

If the diode quenching impedance $Z_Q$ for a typical circuit such as that of FIG. 1 is plotted on the Smith chart, it will generate a curve such as curve 28 in which the numbers indicate typical frequencies of 10 and 20 megahertz, respectively. Likewise, if the bias circuit impedance $Z_B$ is similarly plotted, it may typically generate a curve such as curve 29. The point 30 at which the $Z_Q$ characteristic 28 crosses the zero reactance line 27 represents the value of $Z_Q$ at zero frequency ($f$=0) and can be shown to be given by $$Z_Q(f=0) = R_n - R_{sc} \quad (6)$$

as will be shown more rigorously in Appendix I. One criterion for stable oscillation is that the point 31 at which the $Z_B$ characteristic 29 crosses the zero reactance locus 27 must represent a higher resistance than that of point 30. In other words, on the chart as shown point 31 must lie to the right of point 30 or, $$Z_B(f=0) > R_n - R_{sc} \quad (7)$$

Another criterion is that, if characteristic 29 crosses characteristic 28, it must be at an intersection point 32 at which the frequency of $Z_B$ is greater than the frequency of $Z_Q$, or in other words $Z_B(f_1)$ equals $Z_Q(f_2)$ only when frequency $f_1$ is smaller than frequency $f_2$. If characteristics 28 and 29 intersect it may be stated mathematically that the parameters must comply with the relationship $$Z_B(f_1) \overset{lim}{\rightarrow} Z_Q(f_2)\ {}^{f_1 < f_2} \quad (8)$$

Figure 3:
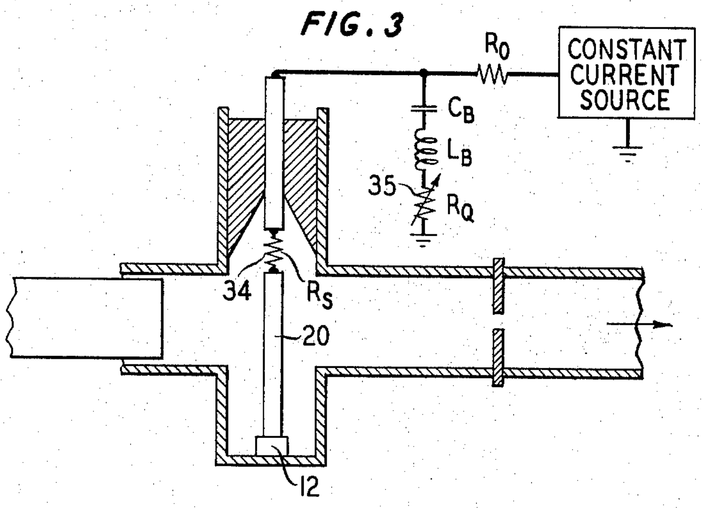
FIG. 3 is an illustrative embodiment of apparatus used to determine the parameter $Z_Q$.

A convenient technique for measuring the parameter $Z_Q$ of the circuit of FIG. 1 is illustrated by the schematic circuit of FIG. 3. In FIG. 3, bias circuit oscillations at a frequency $f_1$ are induced, and then barely quenched by adjusting the bias circuit impedance. Next, the diode is removed from the circuit and the impedance of the circuit is measured from the diode's position to give $Z_Q$ at frequency $f_1$.

As is described in more detail in Appendix I, the bias circuit oscillation is induced by reducing the value of a resistor 34 in the bias line 20 and adding to the bias line a shunt resonant circuit with a quench resistor 35. The resonant circuit is tuned to a bias oscillation at the desired frequency, and the induced oscillations are then quenched by adjusting variable resistor 35. Measuring the circuit impedance with the diode removed then gives the desired measurement of $Z_Q$ and this measurement is repeated for several submicrowave frequencies to generate curve 28 of FIG. 2.

Design and measurement of the bias circuit impedance $Z_B$ needed for complying with the above criteria are discussed in detail in Appendix I, and several examples are given.

It will be clear that compliance is facilitated by using a constant current source as the bias source 19, and that advantage may be taken of parasitic capacitance 15, providing it is not too large. The constant current source also maintains stability of the Impatt diode operation. Once understanding the requirements to be complied with, and having generated the curve 28 in FIG. 2, it is a straightforward matter of design for one skilled in the art to design the bias circuit impedance $Z_B$ to comply with these requirements. Thus, it becomes clear that a resistance-inductance filter may be included external of the microwave cavity resonator and that the inductance may bypass the resistance to substantially eliminate dc current dissipation.

These and other embodiments of the invention may be made by those skilled in the art without departing from the spirit and scope of the invention.

APPENDIX I

I. Physical Origins of the Negative Resistance

The three essential ingredients which cooperate to produce the low-frequency negative resistance are 1. a large-signal rectification effect wherein the dc voltage (at constant current) is lowered by an increase in the microwave voltage amplitude,
2. the dependence of the diode's microwave conductance, $g_d(V_a,I_d)$ upon the microwave voltage amplitude $V_a$, and the dc bias current, $I_d$, and
3. the microwave circuit constraint $$g_d(V_a,I_d) + G(\omega) = 0 \quad (9)$$

where $G(\omega)$ is the microwave circuit conductance into which the diode oscillates. The first of these, the rectification effect, is summarized in the paper by W. T. Read Jr., "A Proposed High-Frequency, Negative Resistance Diode," *Bell System Technical Journal*, Vol. 37, No. 3, pp. 401–446, Mar. 1958 by the equation (for the Read diode)

$$V_d = (Wt/2\epsilon A)\ I_d - (m/4WE_c)\ V_a^2 + \text{constant} \quad (10)$$

where $V_d$ = dc voltage
$W$ = depletion layer width
$t$ = drift zone transit time
$\epsilon$ = dielectric constant
$A$ = junction area
$m = (E d/\alpha)\ (\alpha/dE)|_{Ec}$ = percentage change in the avalanche coefficient $\alpha$ for a percentage change in the electric field and
$E_c$ = critical field for avalanche breakdown. Equation (10) is approximate, neglecting higher powers of $V_a$. Studies made with the nonlinear program described in the paper of Blue, "Approximate Large-Signal Analysis of Impatt Oscillators," *Bell System Technical Journal*, Vol. 48, No. 2, pp. 383–396, Feb. 1969, however, indicate that (10) is an excellent approximation.

The net dc terminal resistance from (10) is then $$R_t = (dV_{dc}/dI_d) = R_{sc} - (mV_a/2WE_c)\ (dV_a/dI_d), \quad (11)$$

where $R_{sc} = Wt/2\epsilon A$ is the space-charge resistance.

From the microwave circuit constraint, we see that the ac voltage amplitude $V_a$ and the dc bias current $I_d$ are (for constant $G(\omega)$) not independent of each other. In fact, $$\frac{dv_a}{dI_d} = -\frac{\left(\frac{\partial g_d}{\partial I_d}\right) V_a}{\left(\frac{\partial g_d}{\partial V_a}\right) I_d} \quad (12)$$

In the usual situation $(\partial g_d/\partial I_d)_{V_a} < 0$ and $(\partial g_d/\partial V_a)_{I_d} > 0$ (remembering that $g_d$ is itself negative), so $dV_a/dI_d > 0$ and the last term of (11) represents a negative resistance. It is this negative resistance which causes the instabilities in the bias circuit. It is associated with basically amplitude modulation of the microwave oscillation. The rectification property is due to the nonlinearity of the avalanche process whereby a sinusoidal field variation about the critical field, $E_c$, produces many more charges on the positive swing than it does on the negative. This means that either the dc current increases, or the dc voltage drops, as the RF voltage increases.

A simple picture then is as follows. A positive fluctuation of the diode current increases the microwave negative conductance (in magnitude). This causes the voltage amplitude, $V_a$, to increase in order to meet the circuit constraint, and the increase in $V_a$ requires a drop in the dc voltage, thereby creating negative resistance.

Equation (11) can be rewritten $$R_t = R_{sc} - (m/2WE_c)\,(1/G)\,(dP_{out}/dI_d) \qquad (13)$$

where $G$ is the microwave circuit conductance at the oscillation frequency and $P_{out}$ is the microwave output power. This form is convenient because G can be estimated and $dP_{out}/dI_d$ can be easily measured in any particular circuit. Doing this, and using published data for other constants, $R_t$ has been calculated for typical silicon, germanium and gallium arsenide diodes designed to operate at 6 GHz. This data is shown in Appendix III and it indicates reasonable agreement with the experimental values also shown. Silicon has the smallest negative resistance and the largest discrepancy between theory and experiment. Germanium has about (−)50 ohms of induced negative resistance, indicating that difficulties might be encountered if biased through a 50 ohm bias line. The gallium arsenide results indicate about (−)120 ohms induced negative resistance. Measured values have been everywhere between (−)85 ohms and (−)150 ohms. On the basis of this data alone, it would be expected that biasing GaAs diodes would be very difficult.

A complete experimental characterization of the low-frequency impedance is given in the next section.

II. Experimental Characterization

The technique used to measure the low-frequency impedance of the diode was to induce bias circuit oscillations and to barely quench them by adjusting the bias circuit impedance. Then the diode was removed from the circuit and the impedance of the circuit was measured at the frequency of the bias circuit oscillation. The quenching impedance, $Z_Q$, measured in this way, is the negative of the small-signal impedance of the diode $Z_t$ and could be measured as a function of the bias circuit oscillation frequency, the microwave loading and the bias current. The microwave frequency of oscillation was always tuned to that for maximum power output.

In order to perform this experiment, it was necessary to use an oscillator and bias circuit with the following two properties: a) a bias circuit which could be made stable or unstable at all values of current and microwave loading, and b) the microwave loading could be varied continuously from above oscillation threshold down to zero external loading. A suitable circuit is one described in the paper of Magalhaes and Kurokawa, "A Single-Tuned Oscillator for Impatt Characterizations," Proceedings IEEE (Letters), Vol. 58, No. 5, pp. 831–832, May 1970, and which is illustrated in FIG. 3.

It comprises a waveguide microwave cavity coupled to a coaxial transmission line. The waveguide cavity is formed between a movable short and an adjustable iris, which is used to couple the cavity to the output waveguide load. The adjustable iris is formed by rotating the rectangular waveguide cavity with respect to the output rectangular waveguide at a flanged joint.

The diode is situated at one end of the coaxial line (its distance from the waveguide was adjustable for tuning purposes) and the coaxial line is terminated on the opposite side of the cavity from the diode in a microwave load. The microwave load is an open circuit to dc and may be represented as a shunt capacitance of about 35 pF at bias circuit frequencies. The dc bias is fed in through the coaxial line from a constant current supply. An isolation resistor of about 200 ohms was used to reduce the effects of the parasitic reactances of the power supply and its leads on the bias circuit impedance. It was found that placing a series resistance $R_s$ (2 watt carbon resistor) in the bias line would stabilize the induced negative resistance formed in the diode. A value of $R_s = 150$ ohms was sufficient to stabilize the diode at all bias currents up through the thermal limit of the resistor $R_s$ and at all microwave loading levels.

The bias oscillation was induced by reducing $R_s$ and adding a shunt resonant circuit with a quenching resistor $R_Q$. The resonant circuit was used to tune the bias oscillation to the desired frequency and it was brought to the quenched, or small-signal, level by adjusting $R_Q$. Measuring the circuit impedance with the diode removed then gave the desired measurement of $Z_Q$.

Figure 4:
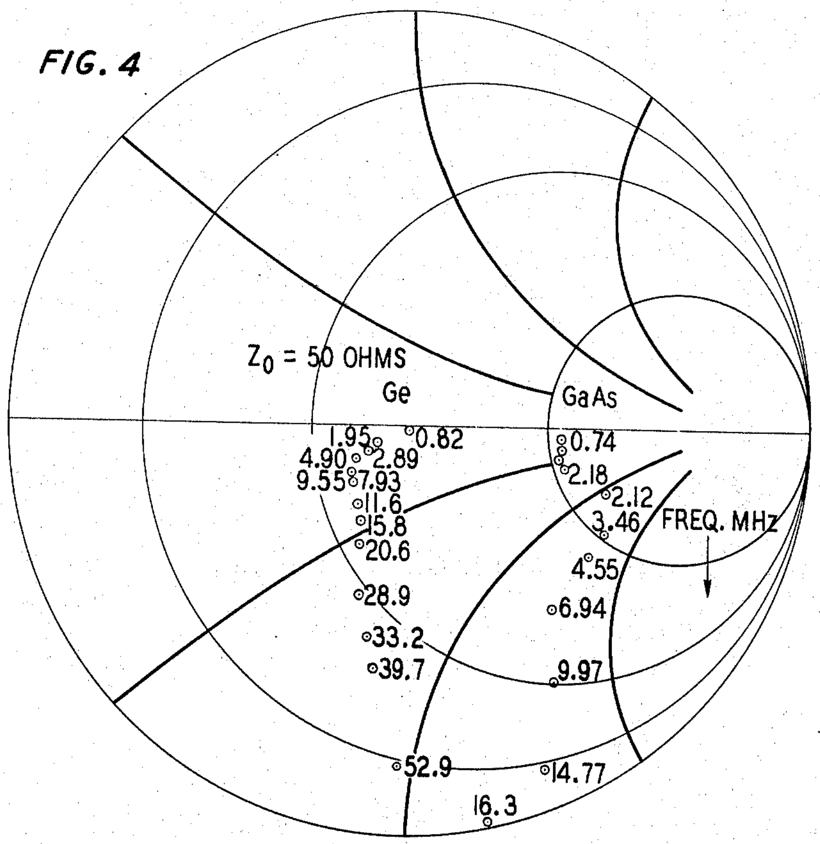
FIG. 4 is a graph of a Smith chart showing specific data taken from one illustrative embodiment of the invention.

The result of such a procedure at constant bias current and constant microwave loading conditions is shown in FIG. 4 for typical 6 GHz Ge and GaAs diodes. Since $Z_t = -Z_Q$, we see from FIG. 4 that the diode impedance has a general low-pass characteristic for the negative real part, becoming positive at frequencies higher than some frequency $f_M$. It is also seen that the reactive part of $Z_t$ is inductive. This general character to $Z_t$ has been observed in all diodes upon which these measurements have been made. The frequency $f_M$ is the maximum frequency at which the bias circuit can be made to oscillate and is dependent upon the loaded Q of the microwave circuit as will be explained in Section III. The scatter in the data from smooth contours is probably due to the difficulty of obtaining identical microwave tuning on successive measurements. The general range of low-frequency asymptotes for $R_t$ for GaAs was from (−)85 ohms to (−)150 ohms. For Ge this range was from (−)35 ohms to (−)75 ohms, although less data is available for the Ge diodes. These experiments have been attempted on Si 6 GHz Impatts as well with the results indicating a maximum observed negative resistance of about (−)20 ohms. However, with the microwave circuit tuned to best overall operation, these 6 GHz diodes would not sustain bias circuit oscillation but only emit large amounts of baseband noise as the bias circuit impedance was lowered. This is explained in Section V where the equivalent circuit of this impedance is developed.

Figure 5:
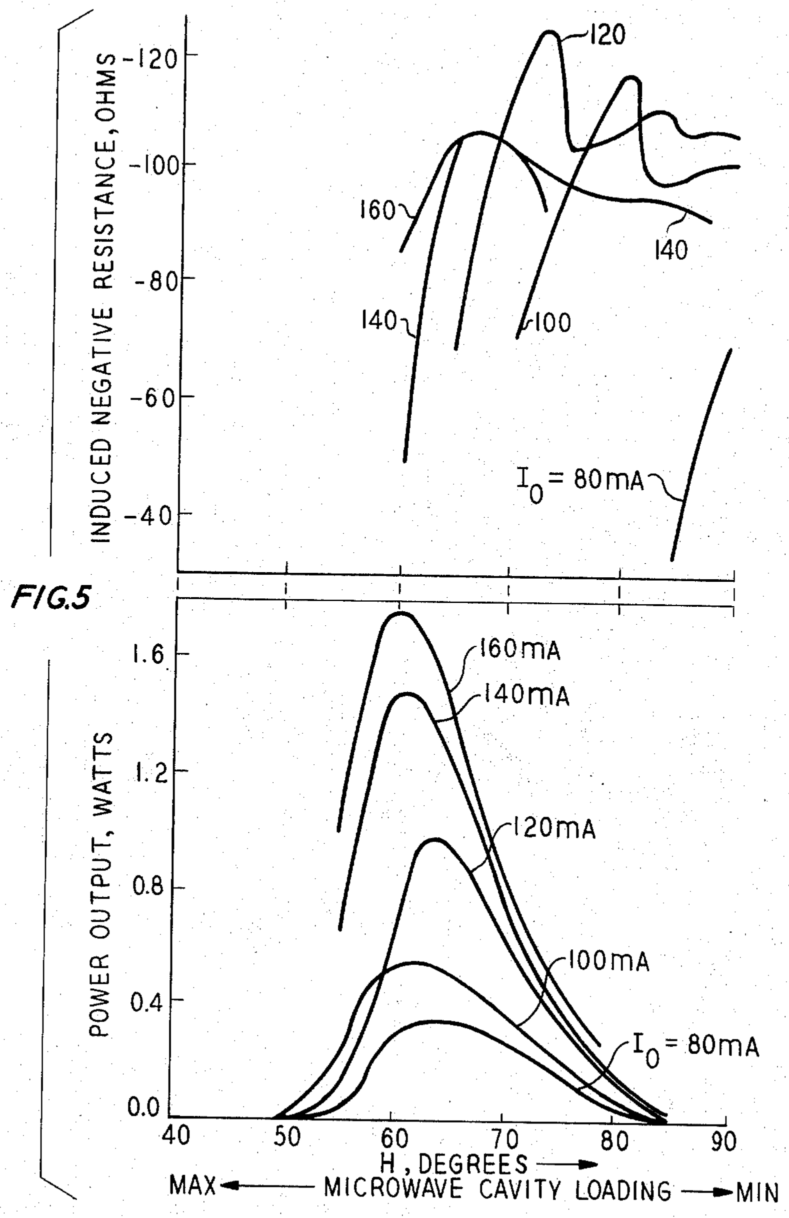
FIG. 5 illustrates graphs of induced negative resistance and output power versus microwave cavity loading in an illustrative embodiment of the invention.

In FIG. 5, the small-signal induced negative resistance, $R_t$, is shown as a function of bias current and microwave loading. This data was all taken at a bias oscillation frequency of ≈5 MHz. Also shown is the output power. The microwave loading is changed by rotating the output waveguide relative to the cavity waveguide, the angle between them denoted by H. For H → 0, the guides are aligned and the microwave cavity has its maximum loading, which implies zero (or at least minimum) microwave voltage amplitude. Increasing the rotation H, one passes through oscillation threshold to maximum power output and finally to maximum oscillation amplitude and zero output power in the minimally loaded condition. Thus, H may be considered to be an indication of microwave voltage amplitude or microwave load conductance. From FIG. 5 we make the following observations:

1. At low bias currents, the negative resistance is small at normal maximum power loading conditions, but does become significant at the lightest loading (H → 90 degrees).
2. The negative resistance increases rapidly with bias current until it saturates at a level around (−)120 ohms (for this diode). Further increases in current tend only to translate the maximum negative resistance toward greater microwave loading conditions (smaller H), with the result that at 160 mA, the loadings for maximum power and maximum induced negative resistance are nearly coincident.
3. There appears to be considerable structure to the negative resistance curves. This structure appears to be real since a decrease in either the current or the angle H from the condition $I_o = 140$ mA, $H = 75$ degrees results in an increased amplitude of oscillation, and sometimes burnout of the diode.

The reason the negative resistance increases with current at low currents and increases with $H$ at the lower $H$ is presumably associated with an increase of the voltage $V_a$. The apparent saturation of the negative resistance at higher currents and larger H is not understood. It may be associated with a saturation of the RF voltage $V_a$, or more likely, with the detailed dependence of the diode's microwave admittance, $Y_d$, on $V_a$ and $I_d$ at high $V_a$ and high $I_d$.

Figure 6:
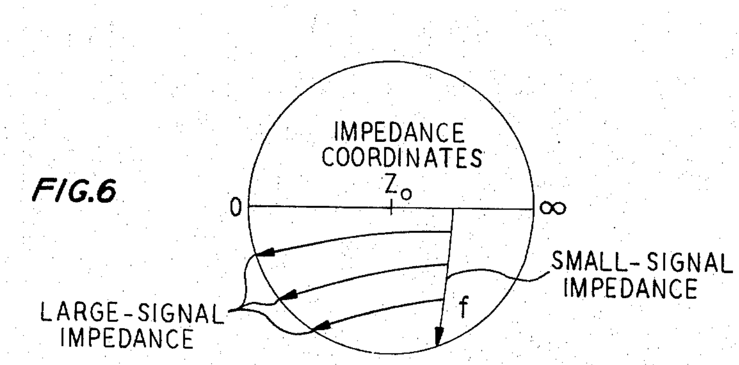
FIG. 6 is a graph of a Smith chart used in illustrating certain principles of the invention.

One further experimental characteristic is that if the bias oscillation is allowed to rise above the quenching level, the real part of $Z_Q$ decreases as shown schematically in FIG. 6. This implies that the device impedance $Z_t$ is open circuit stable and is properly characterized as a negative resistance. It also explains the well-known fact that high-impedance termination of the bias circuit lowers the AM noise significantly. Since the negative resistance acts as an amplifier of noise in the bias circuit, the lower the circuit impedance, the higher the gain and the larger the noise modulation of the microwave power becomes. In the following section, the small-signal equivalent circuit is worked out in detail and most of the observed features are explained on theoretical grounds.

The open circuit stability and large-signal characteristics have a profound significance as to the elimination of both bias circuit oscillations and diode burnout as will be discussed at length in Section IV.

III. Low-Frequency Equivalent Circuit

It is evident by now that the microwave oscillator circuit plays an important role in the existence of the low-frequency negative resistance. The question arises, however, as to the role it plays in determining the bandwidth and magnitude of the negative resistance and why the reactance associated with $R_t$ is always inductive. In this section an equivalent circuit is developed, on an analytical basis, which fits the data of the previous section and is used further in Section IV to consider the problems of stabilization.

Figure 7:
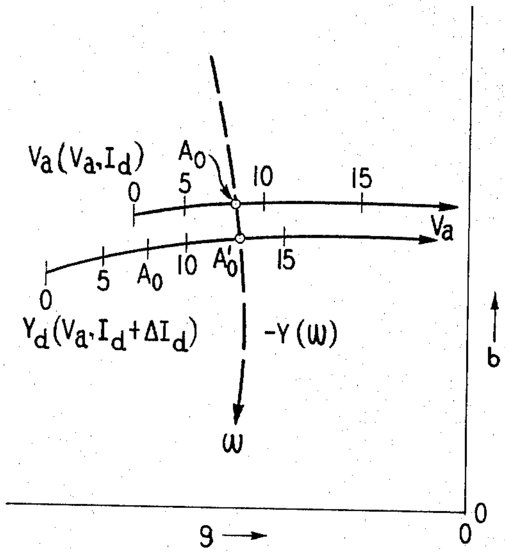
FIGS. 7 and 8 are graphs of conductance $g$ versus susceptance $b$ used in illustrating certain principles of the invention.

To develop the equivalent circuit, a quasi-static model is used in which it is assumed that the diode's microwave admittance, $Y_d(V_a, I_d)$, is an instantaneous function of $V_a$ and $I_d$. For example, a sudden change in the dc bias current is assumed to shift the entire large-signal diode characteristic as shown in FIG. 7 from $Y_d(V_a, I_d)$ to $Y_d(V_a I_d+\Delta I_d)$. Because of the large amount of energy stored in the microwave circuit, however, the RF voltage $V_a$ cannot change instantaneously. Therefore, immediately after the change in bias current, the circuit constraint $Y_d(V_a, I_d) + Y(\omega) = 0$ is not satisfied and can only be satisfied by the growth of $V_a$ from $V_a = A_o$ to a new value $A_o'$ as shown in FIG. 7. Such growth takes time and the amount of delay is related to the bandwidth of the microwave cavity. We can easily imagine that if $I_d$ were to fluctuate rapidly enough, faster than the circuit can respond, the $V_a$ would maintain its average value and the induced negative resistance would disappear.

Using the quasi-static approach mentioned, the low-frequency (baseband) impedance, $Z_t$, of an Impatt diode is derived in the appendix. It is found that $$Z_t = R_{sc} - R/(1+j\omega/a) \qquad (14)$$

with the definitions $$R_n = m/(4WE_c)\ (\sin D/\sin F)\ (dV_a^2/dI_d) \qquad (15)$$

and $$a = (r^2 + s^2/(\partial Y/\partial\omega))\ G \sin F \qquad (16)$$

Here, $r$ and $s$ are saturation parameters associated with the large-signal behavior of the diode admittance $Y_d$ as defined in Eq. (26) of Appendix II, and $Y = G + jB$ is the admittance of the microwave circuit. The angles $D$ and $F$ are defined in FIG. 8. In the admittance plane plot of this figure, $-Y(\omega)$ is the locus of the *negative* of the microwave circuit admittance in the neighborhood of the oscillation frequency $\omega_o$; the arrow indicates the direction of increasing frequency. The large-signal admittance of the diode at frequency $\omega_o$ is assumed to intersect the $-Y(\omega)$ locus at the point P, which in fact determines the oscillation amplitude, $V_a$, and the frequency, $\omega_o$. The line $Y_d(V_a)$ indicates the direction on the admittance plane in which the diode's admittance moves for increased voltage, $V_a$, at constant current. The line $Y_d(I_d)$ is likewise the direction in which the diode's admittance moves for increased $I_d$ at constant oscillation amplitude, $V_a$. The angles F and D give the intersection angles of $Y_d(V_a)$ and $Y_d(I_d)$ with the locus $-Y(\omega)$ as shown in the figure. It is well known that one of the conditions for oscillation at the point P is that $o \leq F \leq \pi$, with $F = \pi/2$ generally giving the best system performance (highest oscillator stability, lowest noise). See the paper of Kurokawa, "Some Basic Characteristics of Broadband Negative Resistance Oscillator Circuits," *Bell System Technical Journal*, vol. 48, No. 6, pp. 1937–1955, July-Aug. 1969.

From (14) and (15) we see that at very low frequencies ($\omega/a << 1$) and if sin D/sin $F = 1$ (a reasonable condition as will be seen) then $Z_t = R_{sc} - R_n$ with $R_n$ the same as found on a dc basis previously. We see that the space-charge resistance is a stabilizing factor, tending to lower the net negative resistance. At low enough frequencies, thermal effects become important and introduce further positive resistance. The latter is neglected here due to the relatively low cutoff frequency for thermal effects compared to $a$.

Considering equation (15) for $R_n$, we see that, if F approaches either 0 or $\pi$, $R_n$ can become very large. In fact $F = \pi/2$ gives a minimum $R_n$ everything else being constant. Intuitively, one can see why $F = 0, \pi$ are critical directions. For these conditions $Y_d(V_a)$ is nearly parallel to $-Y(\omega)$ and slight changes in the current $I_d$ can cause large changes in $V_a$ (and the frequency $\omega_o$ as well).

This dependence on F is consistent with experimental observations. A certain set of Si diodes (6 GHz) were found to not have a large enough negative resistance to cause bias circuit oscillations when tuned in what was considered to be the optimum manner. Detuning the cavity, however, and readjustment of the power output to the same value gave very large bias circuit oscillations with a very definite FM microwave spectrum. It is presumed that the FM is mostly due to F being different from $\pi/2$.

Separately considered, the angle D could be used to minimize $R_n$ or to even make the net resistance positive. The difficulty with this is that the total angle F+D is determined totally by the diode's characteristics and has nothing at all to do with the microwave circuit. The large-signal theories of Scharfetter and Gummel, "Large-Signal Analysis of a Silicon Read Diode Oscillator," *IEEE Transaction on Electron Devices*, Vol. ED–16, No. 1, pp. 64–77, Jan. 1969, and Blue, "Approximate Large-Signal Analysis of Impatt Oscillators," *Bell System Technical Journal*, vol. 48, No. 2, pp. 383–396, Feb. 1969, may be used to show that the angle F+D is close to $\pi$ over most of the useful range of diode operating parameters ($V_a, I_d, \omega_o$). If $F + D \approx \pi/2$, then $D \approx \pi$ *and* $F \approx \pi/2$, then $D \approx \pi/2$ and sin $F \approx 1$ for best system requirements. This dependence of $R_n$ on the angle $D$ indicates, however, that in laboratory testing (providing D+F is not actually $\pi$) it should be possible to reduce the value of $R_n$ and inhibit bias circuit oscillations while at the same time maintaining high power output. Experimentally, in coaxial circuits with many degrees of freedom in the tuning it is found that burnout and bias oscillations can usually be avoided by very carefully increasing the current by small increments and retuning slightly.

The parameter $a$ is shown in Appendix II to be one-half the 3 dB modulation bandwidth of the oscillator. $a$ achieves its maximum value at $F = \pi/2$. We therefore see from Equation (14) that the negative resistance has a lowpass characteristic and that [Re $Z_t - R_{sc}$]has a cutoff frequency $\omega_c = a$ equal to that of the microwave circuit.

Figure 9:
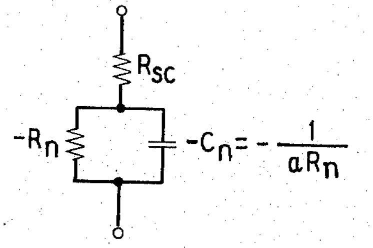
FIG. 9 is an equivalent circuit of a bias circuit used in illustrating certain principles of the invention.

The equivalent circuit of $Z_t$ from Equation (14) is shown in FIG. 9. $Z_t$ is inductive but the frequency independent representation involves a negative capacitance $-C_n = (1/aR_n)$ . We note that, in accordance with the cutoff frequency mentioned above, the product $(-R_n)(-C_n) = +1/a$ gives the time constant associated with the microwave oscillator bandwidth. For any value of $R_n/R_{sc}$, there exists a maximum frequency for which $Z_t$ has negative real part. We call this the maximum frequency of oscillation, $f_M$, and it is given by $$f_M = a/(2\pi)\sqrt{(R_n/R_{sc}) - 1}\ . \quad (17)$$

Thus, the maximum frequency of oscillation may be greater than or less than $a/2\pi$, depending on the ratio $R_n/R_{sc}$.

Figure 10:
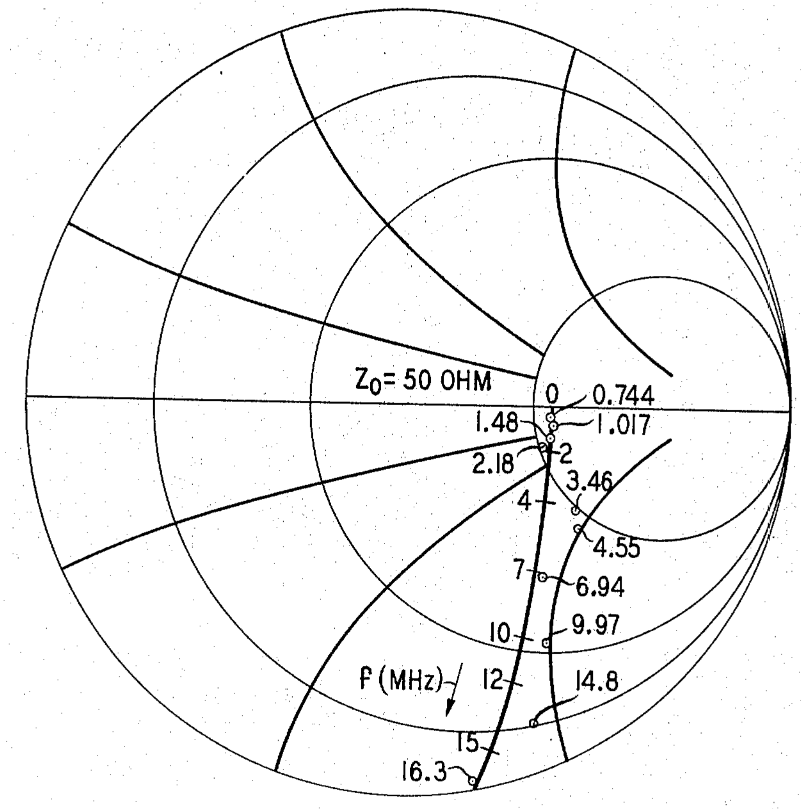
FIG. 10 is a Smith chart illustrating data concerning an illustrative embodiment of the invention.

There are three independent parameters in the equivalent circuit for $Z_t$; namely $R_n$, $R_{sc}$ and $a$. By measuring the impedance $Z_t$ at three frequencies one may calculate these parameters. Usually, $R_{sc}$ can be measured in dc tests, so that only two measurements of $Z_t(\omega)$ are required. In FIG. 10, the data for the GaAs diode of FIG. 4 have been replotted along with the equivalent circuit curve obtained from the data $R_t(\omega = 0) = R_{sc} - R_n = -110$ ohms, $f_M \approx 17$ MHz and $R_{sc} = 33.6$ ohms. The scatter in the data points is, as was mentioned before, due to the difficulty of disassembling the microwave circuit and reassembling it to the same RF conditions after every measurement. Under the circumstances, the agreement is considered to be good.

To illustrate the meaning of $a$ further, consider the simplest model of oscillator and circuit possible in which only the diode's conductance is a function of $V_a$ (this puts $r = 0$ in Equation (16) and the circuit conductance does not depend upon frequency. Then Equation (16) becomes $$a = (sG/(\ \ B/\ \ \omega) = (s\omega_o/2Q_L) \quad (18)$$

where $Q_L$ is the loaded cavity $Q$. Since at maximum output power $s \approx 2$, we can write under conditions for maximum power $$a \approx 2\pi\ \Delta f \quad (19)$$

where $\Delta f$ = the full 3 dB bandwidth of the loaded cavity. Equation (17) then becomes $$f_M = \Delta f \sqrt{(R_n/R_{sc}) - 1} = (f_o/\ Q_L) \sqrt{(R_n/R_{sc}) - 1}.$$

This dependence of $f_M$ on $Q_L$ was tested by making the experimental waveguide cavity length $\approx 3a_g/2$ instead of $\approx a_g/2$ and finding the maximum frequency of oscillation. This should raise $Q_L$ by a factor of three and therefore decrease $f_M$ by a factor of one-third. The measured result was a decrease in $f_M$ by a factor 0.41. This discrepancy may again have been due to not achieving the same RF conditions in the two cases.

In another test of Equation (20), the loaded cavity Q was measured after having made the bias circuit impedance measurements necessary to determine $f_M$, $R_{sc}$ and $R_n$ for the same microwave circuit conditions. The results were $a = 113.3\times10^6$, $R_{sc} = 35$ ohms, $R_n = 119$ ohms which, together with the assumption $s = 2$, give $Q_L \approx 261$. The microwave measurement yielded $Q_L \approx 268$, in good agreement.

We conclude that Equation (14) is a good representation of the terminal impedance at baseband frequencies in a large-signal Impatt diode oscillator and that $a$ is well approximated by either (18) or (19).

IV. Bias Circuit Stabilization

Up to this point, the major emphasis has been on characterizing the induced negative resistance and discussing its role as the cause of bias circuit oscillations and tuning-induced burnout. We now turn our attention toward the principles and techniques of the stabilization of this negative resistance. By stabilization we mean the achievment of small-signal stability so that any fluctuation in bias circuit current or voltage eventually decreases to zero. In addition to small-signal stability, we also require large-signal stability so that transients in power supply lines cannot cause instabilities to develop.

A. Stability Criterion

The stability criterion is derived by starting with the loop impedance equation $$(Z_B + Z_t)i_B = e_n$$

where $Z_B$ is the bias circuit impedance, $i_B$ the fluctuating component of current and $e_n$ is an assumed noise voltage. In the complex frequency plane ($s = \sigma + j\omega$), if $Z_B + Z_t$ has any zeros in the right-half plane ($\sigma > 0$) that root will grow in time and the circuit plus diode is unstable. The Nyquist criterion is used to determine the number of zeros minus the number of poles of $Z_B + Z_t$ that are in the right-half plane. This is not so convenient here since we are working with $Z_t$ and $Z_B$ as two separate sets of data and can only change the design of $Z_B$. We therefore consider the function $Z_Q - Z_B$, where $Z_Q = -Z_t$. This must have the same number of poles and zeros in the right-half plane. Now, however, we plot the loci of $Z_Q$ and $Z_B$ separately as $\omega$ goes from − to + and consider the vector pointing from $Z_B(\omega)$ to $Z_Q(\omega)$. We then see that the net number of rotations of the vector $Z_Q(\omega) - Z_B(\omega)$ indicates the number of zeros minus the number of poles in the right-half plane. In addition, since $Z_B$ is a passive driving point impedance function it cannot have any poles or zeros in the right-half plane. Therefore, $$Z_Q(s) - Z_B(s) = (R_n/1+s/a) - R_{sc} - Z_B(s)$$

has no poles in the right-half plane and the number of rotations of the impedance vector $Z_Q(\omega) - Z_B(\omega)$ gives directly the number of right-half plane zeros.

Figure 11:
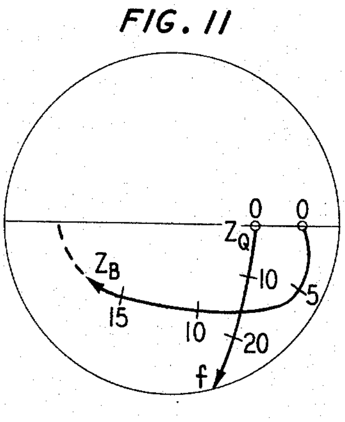
FIGS. 11 and 12 are Smith charts illustrating certain principles concerning the invention.
Figure 12:
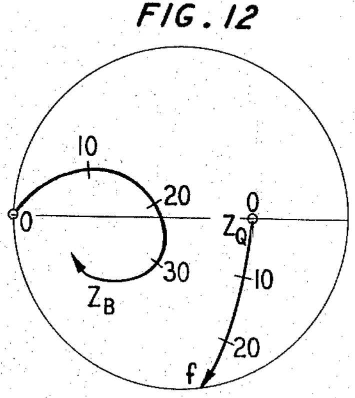

To understand this in practical terms, we show schematically in FIGS. 2, 11 and 12, three conditions: stable, unstable and conditionally stable for a typical bias circuit. The bias circuit impedance, $Z_B(\omega)$, and the diode quenching impedance, $Z_Q(\omega)$, are separately plotted as a function of frequency over the complete frequency range for which $Z_t(\omega)$ has negative real part. As described previously, the criterion then becomes: The bias circuit is stable if, at the point P where the two loci intersect, the frequency $\omega_{PQ}$ on the $Z_Q$ locus is lower than the frequency $\omega_{PB}$ on the $Z_B$ locus; otherwise an instability exists. In FIG. 2, the criterion is satisfied and the circuit is stable. In FIG. 11, the criterion is not satisfied and the circuit is not stable. In FIG. 12, there is not even an intersection of $Z_B$ with the small-signal locus $Z_Q$. However, $Z_B(\omega)$ does lie in the large-signal region of $Z_Q$ (see FIG. 6) and such a condition is conditionally stable. At small-signal levels, no growing root appears, but if the excitation becomes large through some disturbance, then a large-signal instability can exist. We note that changes in the bias current or microwave loading can move $Z_Q$ all the way down to zero impedance and therefore such a circuit configuration as shown in FIG. 12 would be almost certain to burn out the diode.

B. Some Examples

We now give some simple examples which illustrate the above criterion and shed light on some commonly used biasing schemes.

1. Constant Current Supply — Maximum, Equivalent Lumped Capacitance

Figure 13B:
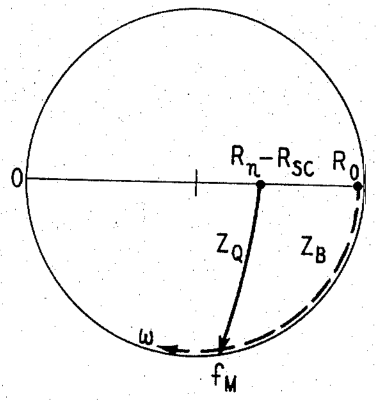
FIGS. 13B, 14B, 15B, 16B and 17B are Smith charts illustrating characteristics of the bias circuits of FIGS. 13A, 14A, 15A, 16A and 17A, respectively.
Figure 13A:
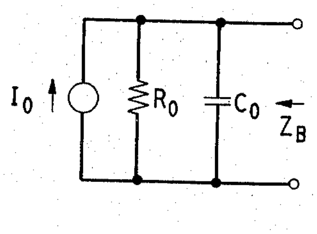
FIGS. 13A, 14A, 15A, 16A and 17A are equivalent circuits of Impatt diode bias circuits used for illustrating various principles of the invention.

The circuit of FIG. 13A represents a constant current supply with large shunt resistance and perhaps large shunt capacitance. FIG. 13B shows the impedance diagram assuming that $R_o \rightarrow \infty$. The maximum capacitance $C_{OMAX}$ that can be tolerated before inducing instability is that which has a reactance equal to that of $Z_Q$ at $f = f_M$, the maximum oscillation frequency. This is $$C_{OMAX} = (1/a)\ (1/R_n - R_{sc})\ .$$

For the GaAs oscillators used for the data of FIGS. 2 and 3, we had $R_n - R_{sc} \approx 120$ ohms and $a \approx 2\pi\times10^7$ rad per sec, which gives $C_{OMAX} = 140$ pF.

2. Constant Current Supply — Series Resistance

Figure 14B:
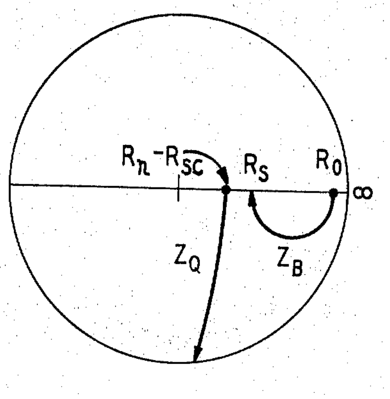
Figure 14A:
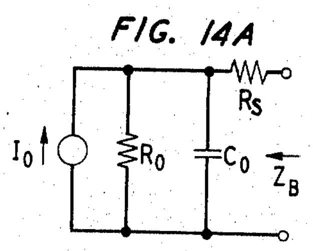

The addition of series resistance between the shunt capacitance and the diode, as in FIG. 14A, gives the impedance diagram shown in FIG. 14B. Stability is predicted for $R_s > R_n - R_{sc}$. It should be noted here that this is the easiest possible way to stabilize the bias circuit and were it not for the large dc power dissipation incurred in $R_s$, this would be ideal. The larger $R_s$ is, the larger the difference between $Z_B(\omega)$ and $Z_Q(\omega)$ and the less the noise amplification is in the bias circuit, giving less up-converted noise in the microwave spectrum.

3. Constant Voltage Supply

Figure 15B:
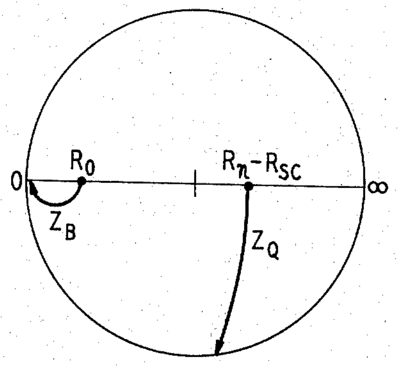
Figure 15A:
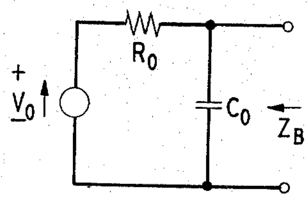

For a constant voltage supply, the series resistance is usually very small and $C_O$ is large. FIGS. 15A and 15B show the circuit and impedance diagram and we see that this is a conditionally stable circuit. As the bias current is turned up from zero, the $Z_Q$ locus moves through the low impedance region and this scheme is certain to burn out diodes. The addition of a large series resistance moves the whole $Z_B$ locus to the high-impedance region and stability again is indicated.

4. Constant Current Supply — Series Inductance

Figure 16A:
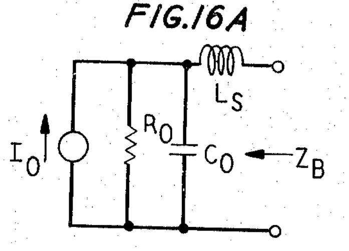
Figure 16B:
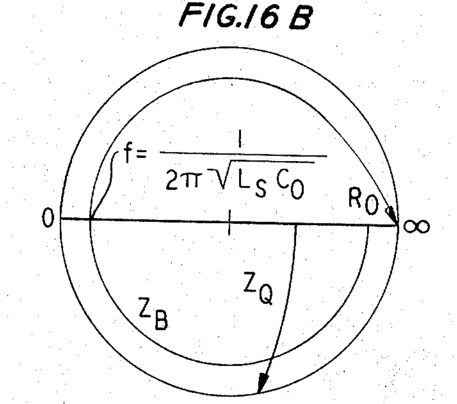

The addition of a large series inductance, as shown in FIG. 16A, might be thought to hold the current more constant and therefore add stability. In fact, such an addition creates a series resonance which lowers the bias circuit impedance at all frequencies below the resonance. Thus, as shown in FIG. 16B the $Z_B(\omega)$ locus must intersect the $Z_Q(\omega)$ locus at a lower frequency (on $Z_B$) and this is in the direction of making the circuit unstable. Thus a series inductance worsens stability. Of course, some inductances have rather large series resistances and this may in itself tend to improve stability.

5. Constant Current Supply — Resistive Choke Stabilizer

Figure 17A:
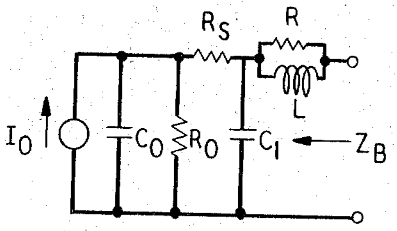
Figure 17B:
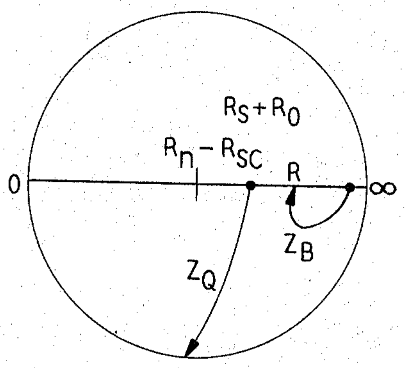

The need to reduce the dc loss in the stabilizing circuit forces one to consider parallel inductance-resistance networks as shown in FIG. 17A, which is an equivalent circuit form of the bias circuit of FIG. 1. The constant current supply is shown with parasitic shunt capacitance $C_O$ and series resistance $R_s$. $R_s$ must be greater than $R_n - R_{sc}$ for this scheme to work, but it only is used to stabilize the lower frequency range and may therefore be put further from the diode, and in fact it may be eliminated by substituting other means. Between $R_s$ and the diode there is additional shunt capacitance denoted by $C_1$. To stabilize the effects of $C_1$, a parallel inductance-resistance network can provide the locus $Z_B$ shown (approximately) and therefore stabilize the oscillator.

A simple design criterion may be formulated by assuming $R_s$ to be very large. By choosing L/R large enough, the locus of $Z_B$ may be made to resemble that of the pure series resistance, shunt capacitance case as closely as desired. From a graphical evaluation the criterion $L=3C_1R^2$ together with R=2 to 5 times $R_n-R_{sc}$ gives an adequate margin of stability. For the GaAs oscillator circuit, an experimental model of this choke was made with R = 470 ohms, and L = 75 $\mu$H. This would satisfy the above criterion for a capacitance of 100 pF. In actual fact, it was possible to make $C_1$ = 3000 pF without causing instability. With $C_1$ = 10,000 pF, the diode burned out.

Figure 18:
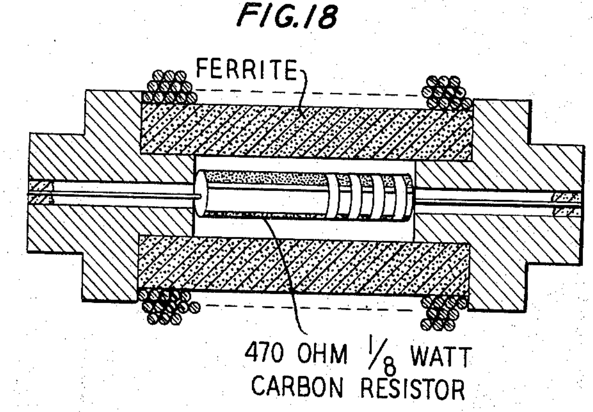
FIG. 18 is a partially sectional view of a submicrowave frequency filter that may be used in an Impatt diode bias line to suppress spurious oscillations in accordance with one embodiment of the invention.

The technique used to construct the choke is illustrated in FIG. 18. The body of the choke was made of a ferrite material similar to that used in low-frequency inductors. A hole was drilled through the center and a 470 ohm one-eighth watt carbon resistor inserted. The winding around the ferrite was made of three layers of number 35 FORMVAR wire. Attached to the end are brass caps which thread into the center conductor of the coaxial bias line. This choke was placed at the same position indicated for $R_s$ in FIG. 3. A broader bandwidth might be achieved by lowering the resistance and inductance values, with some sacrifice of stability margin.

In the particular model built, no attempt was made to insure low reflections at microwave frequencies from the bias circuit when the choke was inserted. It would be desirable to do this for a practical oscillator.

With this resistive choke stabilizing network, a GaAs Impatt oscillator was made to give 3.4 watts of output power with 12 percent efficiency at 250 mA bias current. Without any stabilization, diodes of this same type (breakdown capacitance ≈2.5 pF, breakdown voltage ≈ 105 volts) consistently burned out at 80 to 100 mA. This network then has vastly improved the stability of the bias circuit, but provides lossless dc power transmission from the constant current supply to the diode.

A word of warning about the general use of chokes for stabilization: if the inductance is not large enough, such a choke actually worsens the instability and hastens burnout.

6. Bias Circuit Line Length

In the previous examples it has been assumed that the terminations specified were all positioned exactly at the diode. In fact, this cannot be true and therefore a finite length of transmission line is necessary between the diode and the termination. This effect causes the termination impedance to be transformed to a lower impedance and increases the likelihood of an instability. This places a limit on the length of line that can be tolerated between the diode and the stabilizing network. For example, for the GaAs data of FIG. 4, and a pure stabilizing resistance of 500 ohms, the maximum length of line is about $l_{MAX}=0.09\lambda$ at a frequency of about 13 MHz. But $\lambda=c/(f\sqrt{\epsilon_r})$, where $\epsilon_r$ is the dielectric constant of the material in the bias line. This gives about 2 meters for air line with $\epsilon_r=1$. In common microwave absorbent materials such as Eccosorb MF 124, $\epsilon_r=27$ and $l$ reduces to 40 cm. This is for a medium Q oscillator, $Q_L$ being ≈250. For a low-Q oscillator ($Q_L \approx 25$) the frequencies all will scale with 1/Q so the line length then reduces (in the Eccosorb material) to ≈4 cm, which is beginning to be difficult to do.

Figure 19:
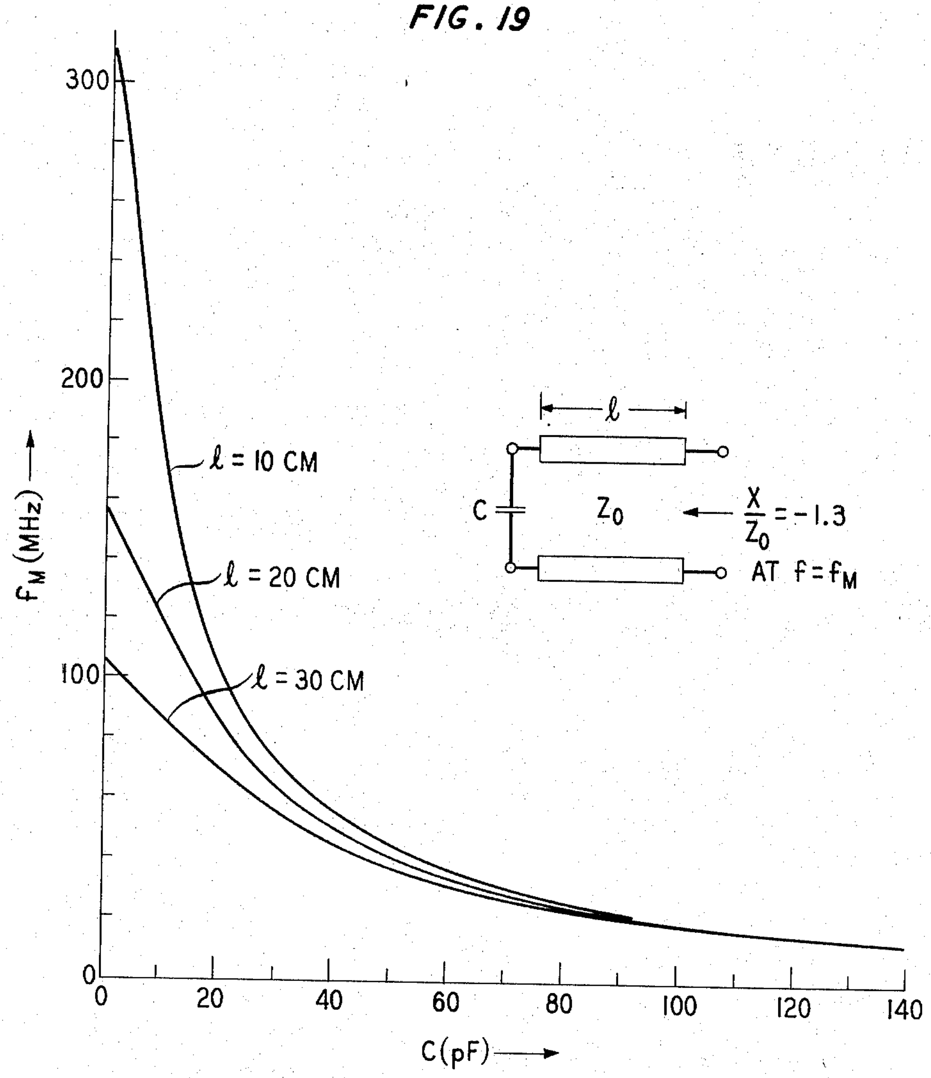
FIG. 19 is a graph of frequency $f_M$ versus capacitance C used for illustrating various principles of the invention.

If the termination is frequency dependent, the effect of line length can be more pronounced. An example, a length $l$ of transmission line terminated in a pure capacitance is illustrated in FIG. 19. Since at $f=f_M$, $X_Q/Z_o=-1.3$ for the GaAs oscillator (see FIG. 2), the frequency at which $X_B/Z_o=-1.3$ gives the maximum $f_M$ tolerable without initiating bias instabilities for each value of C. This value of $f_M$ is plotted versus C for $l$ = 10, 20 and 30 centimeters and may be used to derive either $a$ (the maximum value of shunt capacitance, $b$) the maximum length $l$ for a given C and $f_M$, or $c$) the smallest value of microwave loaded $Q$ (Equation (11)) which is tolerable before oscillation or instability occurs. For example, with a capacitance $C=50$ pF, $f_o$ = 6 GHz, $l$= 10 cm and $R_n/R_{sc}=4.3$ we find $f_M \approx 47$ MHz and $Q_L=232$. Thus the loaded Q would have to be greater than 232 in order that a 50 pF shunt capacitance at a distance of 10 cm from the diode would not cause instability in a 6 GHz GaAs oscillator similar to those used in these experiments.

7. Higher Impedance Bias Circuits

If the bias circuit characteristic impedance were made several times larger than the maximum induced value of negative resistance, then a matched termination at all frequencies would insure stable operation. Even small reflections could easily be tolerated, regardless of their distance from the diode. The difficulty with this is that it is very difficult to make good circuits with very high impedance lines. Traditionally, 50 ohms is used. Any increase above that value would materially assist the stabilization of the bias circuit. On the other hand, one could also decrease the impedance of the diode by making its area larger. In either case, difficulty will eventually be encountered because of the problem of matching the diode to the microwave circuit, but it is probable that some gain over the present situation can be had by these techniques.

V. Scaling Laws

The negative resistance of Equation (11) is obviously a function of the diode area and length, the maximum field strength and the avalanche coefficient. It is therefore reasonable to inquire as to how $R_n$ scales with different oscillator designs, material and frequency. This can be worked out rather simply for the Read diode model assumed here, but for abrupt junction pn diodes this model fails to answer the question: how should the design of the diode be changed to decrease the value of $R_n$, while still achieving high-power, high-efficiency microwave operation For the Read diode, in the large-pulse approximation we may assume the negative conductance is approximately $g_d=-(4/\pi)\,I_d/Vhd\,a$.

Then $$\frac{dV_a}{dI_d}=-\frac{\left(\frac{\partial g_d}{\partial I_d}\right)V_a}{\left(\frac{\partial g_d}{\partial V_a}\right)I_d}=\frac{V_a}{I_d}.$$

Therefore, $$(I_d/V_d)\ (dV_a/dI_d) = (V_a/V_d) \equiv \delta,$$

$\delta$ being the normalized ac voltage amplitude and $V_d$ the breakdown voltage of the diode. The ratio $\delta$ is assumed here, as elsewhere, to be invariant with frequency scaling; see the paper of Scharfetter, "Power-Impedance-Frequency Limitations of Impatt Oscillators Calculated from a Scaling Approximation," *IEEE Transactions Electron Devices*, Vol. ED–18, No. 8, pp. 536–543, Aug. 1971. With this assumption we find that $R_n$ for a new, optimally designed diode, as compared with $R_{no}$ for a reference diode is given by $$(R_n/R_{no}) = (m/m_o)\ .\ (V_d/V_{do})\ .\ (I_{do}/I_d) = (m/m_o)\ .\ (Z_d/Z_{do})\ . \qquad (21)$$

Here $Z_d$ is defined as the ratio of the breakdown voltage to the operating current and W.$E_c$ has been set equal to $V_d$.

An interesting application of (21) is to the millimeter-wave Si Impatts designed to work at 100 GHz. For these diodes $V_d \approx 13$ volts, and a typical current is 0.1 amp giving $Z_d = 130$ ohms. For typical 6 GHz Si Impatts $V_d = 105$ volts and a typical current is 0.20 amp, giving $Z_{do} = 525$ ohms. Therefore, $$\frac{R_n\ (100\text{ GHz diode})}{R_{no}\ (6\text{ GHz diode})}\simeq\left(\frac{m}{m_o}\right)\times 0.25.$$

It is found that $R_{no}$ is a few ohms and that $(m/m_o) < 1$ so it is predicted that the millimeter-wave Impatt diodes should have very small induced negative resistance.

VI. Summary and Conclusions

In this appendix we have defined and solved one of the most important and least understood problems in the design of Impatt diode oscillator circuits. It has been shown that a low-frequency negative resistance is induced in the Impatt diode by the large-signal characteristics of the oscillator. This low-frequency negative resistance has been shown to be responsible for both bias circuit oscillations and a class of low current burnouts, normally called "tuning-induced" burnouts. The large up conversion of noise that often occurs is also caused by this same effect.

The origin of the negative resistance was shown to be the combination of the rectification property of the nonlinear ac avalanche, the coupling of fluctuations in the bias current to fluctuations in the microwave voltage amplitude by the microwave circuit oscillator constraint, and the fact that increases in the microwave voltage amplitude and dc bias current generally drive the large-signal microwave admittance of the diode in opposite directions on the admittance plane. Calculations were made showing the correctness of this picture and were applied to Si, Ge and GaAs diodes designed for 6 GHz operation. The agreement with experimental results is good, showing a small value of negative resistance for Si (typically less than 10 ohms), somewhat larger for Ge (typically 35 to 75 ohms) and larger yet for GaAs (typically 85 to 150 ohms).

A reasonably complete experimental characterization of this negative resistance was given, showing its dependence on baseband frequency, dc bias current and microwave loading conditions. It was found that at low enough bias currents, the negative resistance was small for microwave loads near those which gave maximum power. At higher bias currents, however, the negative resistance approached its maximum value at or near optimum loading conditions. It was also found that the negative resistance had a low-pass frequency characteristic and an inductive reactance associated with it. The negative resistance was found to go to zero at a frequency called $f_M$, the theoretical maximum frequency of oscillation, and $f_M$ was found experimentally to be roughly inversely proportional to the microwave circuit's loaded Q factor. It was found that for large-signal bias circuit oscillations, the negative resistance decreased and the reactance remained approximately constant. This fact indicates open circuit stability and is very important in the stabilization of the bias circuit.

An analysis was performed and an equivalent circuit was derived, showing that the inductive reactance observed experimentally is best represented by a negative capacitance, $-1/aR_n$, in parallel with the negative resistance, $-R_n$, all in series with the space-charge resistance, $R_{sc}$. This circuit predicts several aspects of the small-signal behavior of the induced negative resistance, and allows the stabilization techniques to be designed in a straightforward manner. The agreement of this equivalent circuit with the experimental results is good and it shows in detail how the interaction of the microwave circuit and diode admittances affect the low-frequency negative resistance. In particular, it is shown that the maximum frequency of oscillation, $f_M$, is given by $$f_M = (f_o/Q_L)\quad \sqrt{(R_n/R_{sc} - 1}$$

where $f_o$ is the microwave frequency of oscillation, $Q_L$ is the loaded Q of the microwave cavity, $R_{sc}$ is the space-charge resistance of the diode and $R_n - R_{sc}$ is the low frequency asymptote of the negative resistance. Smith chart plots of the negative of the diode's small-signal terminal impedance, $(-)Z_t$, are given for various values of $R_n/R_{sc}$ and normalized frequency. The shape of these loci is found to vary somewhat, though not drastically, with the choice of impedance normalization used. When normalized to 50 ohms (which is greater than $R_{sc}$) the contours always appear somewhat as shown in FIG. 4.

Stabilization techniques were discussed, beginning with the development of a simple means of judging the stability of a given oscillator and bias circuit. Several examples of stable and unstable conditions were given including a. A calculation of the maximum equivalent lumped shunt capacitance that can still remain stable, b. Discussion of the effects of line length in the bias circuit which indicated the desirability of placing any stabilization network as close to the diode as possible but at the same time indicating that it need not be exactly at the diode, c. A stabilizing network consisting of a pure series resistance, $R_s$, in the bias circuit with $R_s >> R_n - R_{sc}$ (it is required that there be no significant reactance or line length between the diode and $R_s$), and /V d. An alternative stabilizing network in accordance with the invention consisting of a parallel inductance-resistance choke combination that does not dissipate dc power.

Using the choke stabilization network it was possible to get 3.4 watts at 12 percent efficiency from a GaAs diode at 5 GHz with complete stabilization against tuning induced burnout. This means that the microwave circuit tuning could be adjusted at will from no oscillation to the minimum possible loading without inducing burnout or bias circuit oscillation; performance not achievable without stabilization.

As a final topic, the frequency scaling of $R_n$ was considered and it was shown as an example that the 100 GHz Si Impatts should have very small induced negative resistances and therefore the instabilities encountered at lower frequencies and in Ge and GaAs should not be a serious problem for the millimeter-wave Si diodes.

APPENDIX II

It is the purpose of this appendix to derive the equivalent circuit of the low-frequency diode impedance of an Impatt diode oscillator. To do this, the Read diode model is assumed to describe the diode and a quasi-static technique is assumed to describe its interaction with the microwave circuit. From the paper of K. Kurokawa, "Some Basic Characteristics of Broadband Negative Resistance Oscillator Circuits" *Bell System Technical Journal*, Vol. 48, No. 6, pp. 1937–1955, July-Aug. 1969, by rewriting Equations (8) and (9) thereof to apply to admittance, and dropping the noise voltage terms, we may write $$[G(\omega) - g]B'(\omega) - [B(\omega) + b]G'(\omega) + |Y'(\omega)|^2 (1/V_a)(dV_a/dt) = 0 \quad (22)$$

$$[G(\omega) - g]G'(\omega) + [B(\omega) + b]B'(\omega) + |Y'(\omega)|^2 (d\phi/dt) = 0 . \quad (23)$$

Here, $Y(\omega) = G(\omega) + jB(\omega)$ is the microwave circuit admittance, $y = -g+jb$ is the device admittance, $V_a$ and $\phi$ are the microwave voltage amplitude and phase and are assumed to be slowly varying functions of time, and the prime on G, B and Y denotes differentiation with respect to frequency. Equations (22) and (23) describe the change in time of the amplitude and phase of a negative conductance oscillator. In steady-state oscillation, $dV_a/dt = 0$ and $d\phi/dt = 0$, implying $$G(\omega) - g(V_a,I) = 0 , \quad (24)$$

and $$B(\omega) + b(V_a,I) = 0 , \quad (25)$$

which determine the steady-state oscillation amplitude $A_o$ and frequency $\omega_o$. We have assumed that $g$ and $b$ are independent of frequency which only implies that the analysis is restricted to situations in which $Y(\omega)$ varies much more rapidly than $y$.

Let us now presume that the steady-state amplitude and bias current are perturbed by a small amount, that is $$I_d = I_o + \Delta I$$

and $$V_a = A_o + A_o \delta$$

where $\Delta I << I_o$ and $\delta << 1$. Then, linearizing the variation of g and b with both $V_a$ and $I_d$ gives $$g = G - sG\delta + k_g\Delta I$$

and $$b = -B + rG\delta - k_b\Delta I$$

where $$s = -(A_o/G)(\partial g/\partial V_a), r = (A_o/G)(\partial b/\partial V_a)$$
$$k_g = (\partial g/\partial I), k_b = -(\partial b/\partial I) \quad (26)$$

are the RF voltage and dc current linearization parameters of the diode's admittance, evaluated at the steady-state large-signal oscillation point. We may then write $$[sG\delta - k_g\Delta I]B' - [rG\delta - k_b\Delta I] + |Y'|^2 (d\delta/dt) = 0 .$$

Collecting terms $$(d\delta/dt) + a\delta = \Delta f , \quad (27)$$

where $$a = (sGB' - rGG'/G'^2 + B'^2) \quad (28)$$

and $$\Delta f = (B'k_g - G'k_b/G'^2 + B'^2)\ \Delta I . \quad (29)$$

Introducing $$G'/B' = \tan F_c ,$$
$$r/s = \tan F_d$$

and $$F = F_c + F_d + \pi/2$$

we obtain $$a = (\sqrt{r^2+s^2} / (|\partial Y/\partial \omega|)\ G \sin F \quad (30)$$

which is Equation (16) of the text. Equation (28) for Δf becomes $$\Delta f = (\sqrt{k_q^2 + k_b^2} / (|\partial Y/\partial \omega|)) \sin (D) \Delta I . \quad (31)$$

Figure 8:
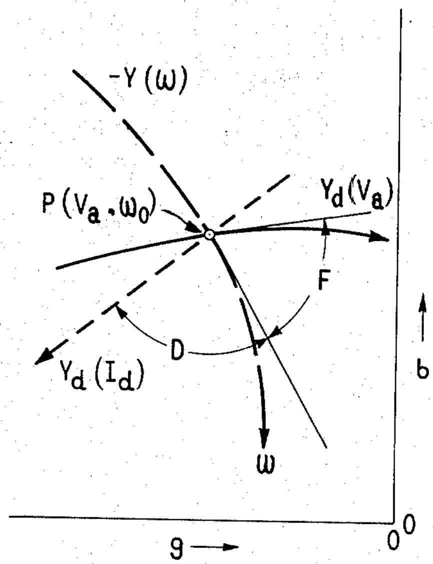

From FIG. 8 it is seen that F is the total angle of intersection between the negative of the circuit admittance curve and the tangent to the large-signal device variation with voltage amplitude, at the steady-state operating point. The angle D is defined by $$D = (\pi/2) - F_I - F_c$$

with $F_c$ defined as above and $F_I$ defined by $$\tan F_I = (k_b/k_g) .$$

The angle $D$ is shown in FIG. 8 and is seen to be the angle between the negative of the circuit admittance and the direction of the variation of the large-signal device admittance with dc current, also at the steady-state operating point.

Assuming an $\exp(j\omega t)$ time dependence for $\delta$ and $\Delta I$, that is $\delta = \mathrm{Real}(\tilde{\delta} e^{j\omega t})$ and $\Delta I = \mathrm{Real}(i_m e^{j\omega t})$, Equation (26)

$$\tilde{\delta} = [\tilde{\Delta f}/a(1+j\omega/a)]$$

or $$\delta = \frac{\sqrt{k_q^2+k_b^2}}{\sqrt{r^2+s^2}} \frac{\sin D}{\sin F} \frac{1}{G} \frac{\tilde{i}_m}{(1+j\omega/a)}.$$

But $$\frac{\sqrt{k_q^2+k_b^2}}{\sqrt{r^2+s^2}} \left(\frac{A_o}{G}\right) = \frac{\left|\frac{\partial y}{\partial I_d}\right|}{\left|\frac{\partial y}{\partial V_a}\right|} = \left|\frac{dV_a}{dI_d}\right|$$

so $$\tilde{\delta} = (1/A_o)(\sin D/\sin F)\ (|\partial V_a/\partial I_d|)\ [\tilde{i}_m/(1+j\omega/a)].$$

We may therefore interpret $a$ as the modulation frequency at which the microwave power in the sideband ($\sim|\delta|^2$) is one-half of its low-frequency response, that is, the common 3 db modulation half-bandwidth of the oscillator.

The rectification equation, Equation (10) of the text, is now assumed to be true as $V_a$ varies slowly with time. This gives for the voltage at frequency $\omega$ (to first order in $\tilde{\delta}$)

$$\tilde{V}_m = R_{sc}\tilde{i}_m - (m/4W\epsilon_c)\ 2V_a^2\tilde{\delta}$$

or $$Z_t = (\tilde{V}_m/\tilde{i}_m) = R_{sc} - (m/4W\epsilon_c)(\sin D/\sin F)\ |(dV_a^2/dI_a)|\ 1/(1+j\omega/a)\ . \qquad (32)$$

We may then write $$Z_t = R_{sc} - (R_n/1+j\omega/a) \qquad (33)$$

where $R_n$ and $a$ are defined by Equations (15) and (16) of the text. $Z_t$ is the terminal impedance of the diode at baseband frequencies and if $R_n > R_{sc}$ then a net negative resistance exists at low frequencies. The equivalent circuit for $Z_t$ is shown in FIG. 7 and its properties are discussed in Section V of the text.

APPENDIX III

| | Si | Ge | GaAs | Source |
|---|---|---|---|---|
| $^C$Breakdown (pF) | ~0.7 | ~0.7 | 2.5 | Measured |
| $^V$Breakdown (volts) | 105 | 45 | 95 | Measured |
| W (Microns) | 5 | 4 | 4 | Sze,p.117 |
| $E_c$(volts/cm) | $3.5\times10^5$ | $2.1\times10^5$ | $6.5\times10^5$ | Sze,p.117 |
| $(E_c/\alpha)(d\alpha/dE\ )_E$ | 5.0 | 6.1 | 19.5 | Calculated |
| $dP_{out}/dI_d$ (watts/amp) | 13.6 | 10 | 24.4 | Measured |
| G (mhos) | $3\times10^{-3}$ | $3\times10^{-3}$ | $6\times10^{-3}$ | Estimated |
| $R_n$ (ohms) | 65 | 117 | 152 | |
| $R_{sc}$ (ohms) | 25 | 59 | 25 | Calculated |
| THEORETICAL | | | | |
| $R_t$ (ohms) | −40 | −58 | −127 | Calculated |
| EXPERIMENTAL | | | | |
| $R_t$ (ohms) | −12 | −50 | −122 | Measured |

What is claimed is:

1. A microwave negative resistance device comprising:

an Impatt diode contained within a cavity resonator resonant at a microwave frequency;

means for deriving a useful output from said resonator at said microwave frequency;

means comprising a bias circuit for applying a dc bias voltage to the Impatt diode;

means for preventing submicrowave oscillations in the bias circuit comprising a submicrowave frequency filter in the bias circuit;

said filter comprising a resistance element connected in parallel with an inductance element;

means comprising the inductance element for providing a dc shunt path around the resistance element, thereby substantially to avoid dissipative loss of dc bias current;

and wherein, at zero frequency the bias circuit, including the filter, has a bias circuit impedance $Z_B$ which conforms to the relationship $$Z_B > R_n - R_{sc}$$

where $R_{sc}$ is the space-charge resistance of the Impatt diode and $R_n$ is a negative resistance of the diode at said submicrowave frequency.

2. The microwave device of claim 1 wherein:

the bias circuit has an impedance $Z_B$ which is of an appropriate value such that $$Z_B(f_1) \rightarrow {}^{lim}\ Z_Q(f_2)^{f_1 < f_2}$$

where $Z_Q$ is the diode quenching impedance of the bias circuit and $f_1$ and $f_2$ are frequencies.

3. The microwave device of claim 2 wherein:

the filter is substantially completely electrically external of the microwave cavity resonator.

4. The microwave device of claim 3 wherein:

the microwave cavity resonator comprises part of a waveguide having a direction of wave propagation;

and the bias circuit comprises a conductor extending from the Impatt diode across the microwave resonator in a direction transverse to the direction of wave propagation.

5. The microwave device of claim 1 wherein:

the bias circuit has a bias circuit impedance as a function of frequency $Z_B(f_1)$ and a diode quenching impedance as a function of frequency $Z_Q(f_2)$;

and $Z_B(f_1)$ equals $Z_Q(f_2)$ only when $f_1$ is smaller than $f_2$.

6. The microwave device of claim 5 wherein:

$$Z_Q(f_2) = (R_n/1\ + j\omega_2/a) - R_{sc}$$

where $R_n$ is the negative resistance of the diode, $R_{sc}$ is the space-charge resistance of the Impatt diode, $\omega_2$ is the angular frequency of $f_2$, and $a$ is given by $$a \approx (\omega_O/Q_L)$$

where $\omega_O$ is the microwave frequency and $Q_L$ is the microwave circuit loaded Q.

7. A microwave oscillator comprising:

an Impatt diode contained within a cavity resonator resonating at a microwave frequency;

means for deriving a useful output from said resonator at said microwave frequency;

a source of dc bias voltage;

a bias circuit for applying the dc bias voltage to the Impatt diode;

said bias circuit comprising reactance and resistance elements and having an impedance such that the DC power loss between the source and the Impatt diode is substantially zero, and which produces an impedance locus such that $Z_B(O) > R_n - R_{sc}$ and, when plotted on a Smith chart, does not intersect the impedance locus $$Z_Q = (R_n/1 + j\omega/a) - R_{sc}$$

at any angular frequency $f$ that complies with the relation $$f \leq f_M = a/2\pi \sqrt{R_n/R_{sc} - 1}$$

where $f_M$ is the maximum frequency of oscillation, $R_n$ is the negative resistance of the diode, $R_{sc}$ is the space-charge resistance of the diode, $Z_B(O)$ is the bias circuit impedance at zero frequency, and $a$ is given by $$a \approx (\omega_O/Q_L).$$

8. The microwave oscillator in claim 7 wherein:

said bias circuit reactance and resistance elements constitute a filter which is substantially completely external of the microwave cavity resonator.

9. The microwave oscillator of claim 8 wherein:

the filter comprises an inductance element for providing a dc shunt path around a resistance element, thereby substantially to avoid dissipative loss of dc bias current.

10. The microwave oscillator of claim 9 wherein:

the microwave cavity resonator comprises part of a waveguide having a direction of wave propagation;

and the bias circuit comprises a conductor extending from the Impatt diode across the cavity resonator in a direction transverse to the direction of wave propagation.

11. The microwave oscillator of claim 9 wherein:

the dc bias source is substantially a constant current source;

and the bias source is shunted by a capacitance.

* * * * *

UNITED STATES PATENT OFFICE
CERTIFICATE OF CORRECTION

Patent No. 3,792,375 Dated February 12, 1974

Inventor(s) Charles A. Brackett

It is certified that error appears in the above-identified patent and that said Letters Patent are hereby corrected as shown below:

Column 4, Equation (4) should read $$a = \frac{\sqrt{r^2 + s^2}}{\left|\frac{\partial Y}{\partial \omega}\right|} G \sin F$$

Column 6, line 42, m = (Ed/α) (α/dE) $_{E_c}$ should read $$m = \frac{E}{\alpha} \frac{d\alpha}{dE}\bigg|_{E_c}$$

Column 10, Equation (16) should read $$a = \frac{\sqrt{r^2+s^2}}{\left|\frac{\partial Y}{\partial \omega}\right|} G \sin F$$

Column 12, line 6, $-C_n = (1/aR_n)$ should read $-C_n = -\frac{1}{aR_n}$

Column 12, Equation (18) should read $$a = \frac{sG}{\left(\frac{\partial B}{\partial \omega}\right)} = \frac{s\omega_o}{2Q_L}$$

UNITED STATES PATENT OFFICE

CERTIFICATE OF CORRECTION

Patent No. 3,792,375 Dated February 12, 1974

Inventor(s) Charles A. Brackett

It is certified that error appears in the above-identified patent and that said Letters Patent are hereby corrected as shown below:

Column 12, line 55, at the end of the line, (20) should be inserted.

Column 16, line 67, $g_d = -(4/\pi)\ I_d/Vhd\ a$ should read $$g_d = -\frac{4}{\pi}\frac{I_d}{V_a}$$

Column 18, line 66, /V should be cancelled.

Signed and sealed this 29th day of October 1974.

(SEAL)
Attest:

McCOY M. GIBSON JR.
Attesting Officer

C. MARSHALL DANN
Commissioner of Patents